(12) United States Patent
Xiao et al.

(10) Patent No.: US 9,277,651 B2
(45) Date of Patent: Mar. 1, 2016

(54) DIFFERENTIAL PASSIVE EQUALIZER

(71) Applicant: Intel Corporation, Santa Clara, CA (US)

(72) Inventors: Kai Xiao, University Place, WA (US); Richard K. Kunze, Woodinville, WA (US)

(73) Assignee: Intel Corporation, Santa Clara, CA (US)

(*) Notice: Subject to any disclaimer, the term of this patent is extended or adjusted under 35 U.S.C. 154(b) by 336 days.

(21) Appl. No.: 13/834,863

(22) Filed: Mar. 15, 2013

(65) Prior Publication Data

US 2014/0266516 A1 Sep. 18, 2014

(51) Int. Cl.
| | |
|---|---|
| *H05K 1/16* | (2006.01) |
| *H01P 3/08* | (2006.01) |
| *H04B 3/14* | (2006.01) |
| *H04L 25/03* | (2006.01) |
| *H05K 1/02* | (2006.01) |
| *H05K 3/10* | (2006.01) |
| *H01P 11/00* | (2006.01) |

(52) U.S. Cl.
CPC .. *H05K 1/16* (2013.01); *H01P 3/08* (2013.01); *H04B 3/14* (2013.01); *H04L 25/03878* (2013.01); *H05K 1/0225* (2013.01); *H05K 1/0234* (2013.01); *H05K 1/165* (2013.01); *H05K 3/10* (2013.01); *H01P 11/00* (2013.01); *H05K 1/025* (2013.01); *H05K 1/0239* (2013.01); *H05K 1/0245* (2013.01); *H05K 1/0246* (2013.01); *H05K 2201/0969* (2013.01); *H05K 2201/09309* (2013.01); *H05K 2201/10015* (2013.01); *H05K 2201/10022* (2013.01); *Y10T 29/49155* (2013.01)

(58) Field of Classification Search
CPC ............ H01P 1/203; H01P 5/04; H01P 3/08; H01P 11/00; H05K 1/16; H05K 1/165; H05K 1/0025
USPC .......................................... 333/33, 246, 22 R
See application file for complete search history.

(56) References Cited

U.S. PATENT DOCUMENTS

| | | | |
|---|---|---|---|
| 5,373,112 A | 12/1994 | Kamimura et al. | |
| 5,963,110 A | 10/1999 | Ihara et al. | |
| 5,995,514 A * | 11/1999 | Lo | 370/463 |
| 2009/0294168 A1 | 12/2009 | Pai et al. | |
| 2011/0019384 A1 * | 1/2011 | Kao et al. | 361/803 |
| 2011/0032048 A1 * | 2/2011 | Wu et al. | 333/12 |
| 2012/0057323 A1 * | 3/2012 | Wu et al. | 361/818 |
| 2013/0249656 A1 | 9/2013 | Vilner | |

OTHER PUBLICATIONS

Extended European Search Report received for EP Patent Application No. 14159981.1, mailed on Jun. 27, 2014, 8 Pages.

* cited by examiner

*Primary Examiner* — Benny Lee
*Assistant Examiner* — Albens Dieujuste
(74) *Attorney, Agent, or Firm* — International IP Law Group, P.L.L.C.

(57) ABSTRACT

Disclosed in the present specification is a circuit board. The circuit board includes a first reference plane and a second reference plane, wherein the second reference plane includes a defected ground structure. The circuit board also includes a signal trace coupled to a signal via, wherein the signal trace is disposed above the first reference plane. The circuit board additionally includes a spiral inductor positioned adjacent to the defected ground structure, wherein the spiral inductor is coupled to the signal via.

27 Claims, 7 Drawing Sheets

200

200

200

DIFFERENTIAL PASSIVE EQUALIZER

BACKGROUND

Transmission of electrical signals in a circuit board can result in energy loss. The energy loss is usually dependent on the frequency of the transmission. For example, signal loss will generally be higher at higher frequencies. The signal loss variation across the frequency range of a signal can make it more difficult for signal receivers to recover the transmitted data. Accordingly, signal equalization techniques are used to equalize the frequency dependent loss. These techniques use active circuit designs that consume power. In some cases, a redriver or repeater is needed for extra equalization, requiring additional power.

BRIEF DESCRIPTION OF THE FIGURES

The following detailed description may be better understood by referencing the accompanying drawings, which contain specific examples of numerous objects and features of the disclosed subject matter.

DETAILED DESCRIPTION

The present disclosure relates to a passive equalization technique for correcting frequency dependent loss in an AC-coupled link. In accordance with embodiments, a circuit in a transmission system can use passive equalization to correct the frequency dependent loss. This passive equalization solution can be less expensive and less power-consuming than present active equalization solutions. In accordance with embodiments, a circuit board configured for passive equalization includes a spiral structure combined with a defected ground structure to introduce inductance to a transmission signal traveling throughout the circuit board.

Figure 1:
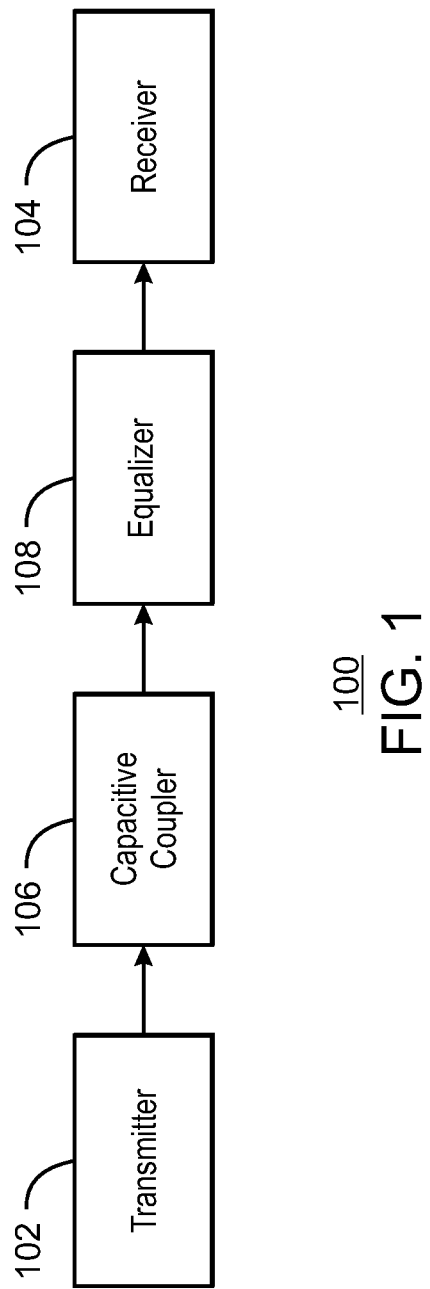
FIG. 1 is a block diagram of a transmission system.

FIG. 1 is a block diagram of a transmission circuit. A transmission signal can be sent from a transmitter 102 to a receiver 104. The transmission system 100 can include a capacitive coupler 106 and an equalizer 108. The transmission circuit 100 can be used in any sort of alternating current (AC) coupled input/output design, such as Peripheral Component Interconnect Express (PCIe), Universal Serial Bus (USB), Serial Advanced Technology Attachment (SATA), Serial Attached Small Computer System Interface (SAS), Direct Media Interface (DMI), QuickPath Interconnect (QPI), Serial Management Interface (SMI), and KG-84 Trunk Interface (KTI), among others. The transmission circuit 100 can be analog or digital. The transmission signal can be differential or single-ended.

The capacitive coupler 106 can be used in the transmission circuit 100 to direct current (DC) bias in the transmission signal such that only alternating current (AC) passes through. The equalizer 108 can help correct the frequency dependent loss of the transmission signal such that the amount of energy lost from the transmission signal is over a frequency range of interest. The equalizer 108 can be passive. In some embodiments, the transmitter 102, the receiver 104, the capacitive coupler 106, and the equalizer 108 are contained on a single circuit board. In some embodiments, the transmitter 102 can be contained on a separate circuit board from the receiver 104, the capacitive coupler 106, and the equalizer 108.

Figure 2:
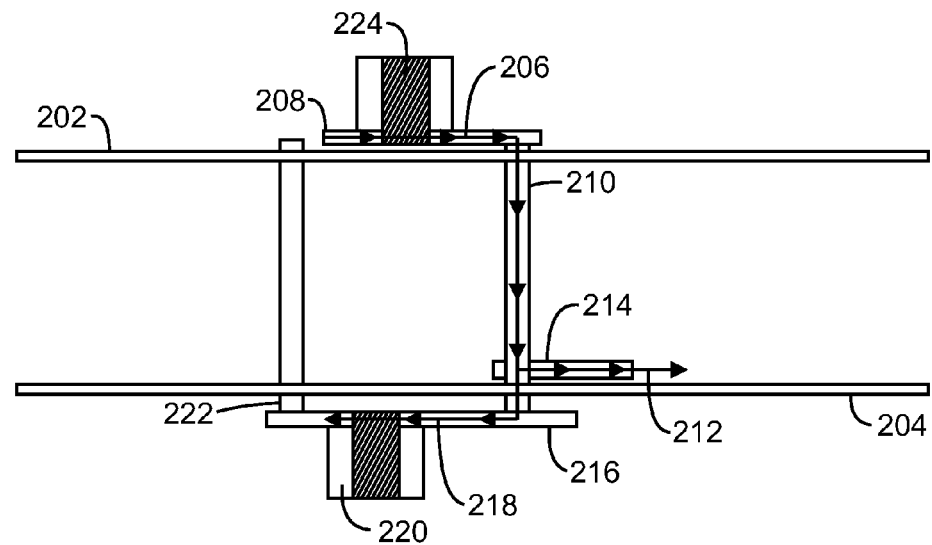
FIG. 2 is a cross-section side view of the circuit board, in accordance with embodiments.

FIG. 2 is a cross section side view of a circuit board, in accordance with embodiments. The circuit board 200 can include a first reference plane 202 and a second reference plane 204. As shown by arrow path 206, a transmission signal can enter the circuit board 200 through a signal trace 208 mounted above the first reference plane 202. The signal trace 206 is coupled to a signal via 210. As illustrated in the arrow path 212, the transmission signal can exit from the circuit board 200 through an exit trace 214 coupled to the signal via 210.

The reference planes 202 and 204 can be planar substrates composed of a conductive material that can act as ground in the circuit board 200. In order to prevent the transmission signal from shorting out, the signal trace 208, the signal via 210, and the exit trace 214 may be separated from the reference planes 202 and 204 by an insulating layer.

The circuit board 200 includes a spiral inductor 216 coupled to the signal via 210. The spiral inductor 216 can introduce inductance to the signal via 210. The spiral inductor 216 can be within proximity of the second reference plane 204. It is to be noted that the spiral inductor 216 is not in direct contact with the second reference plane 204. The spiral inductor 216 can be isolated from the second reference plane 204 by an insulating layer.

The spiral inductor 216 forms a shunt current path that branches from the path of the transmission signal, as illustrated by arrow path 218. The magnitude of the signal loss caused by the current shunt path can be inversely proportional to frequency of the transmission signal. The inductance value of the spiral inductor 216 can be variable in some embodiments.

In some embodiments, the circuit board 200 can also include a termination resistor 220 coupled to the spiral inductor 216 and a ground via 222 that is coupled to the reference planes 202 and 204. The termination resistor 220 is configured to couple the spiral inductor 216 to ground. The resistance value of the termination resistors 220 can be variable.

The second reference plane 204 can include a defected ground structure over which the spiral inductor 216 can reside. The defected ground structure can improve the effectiveness of the spiral inductor.

In some embodiments, the circuit board 200 can include a DC blocking capacitor 224 coupled to the signal trace 208. The DC blocking capacitor 224 can operate as a capacitive coupler and block direct current in the transmission signal.

Figure 3:
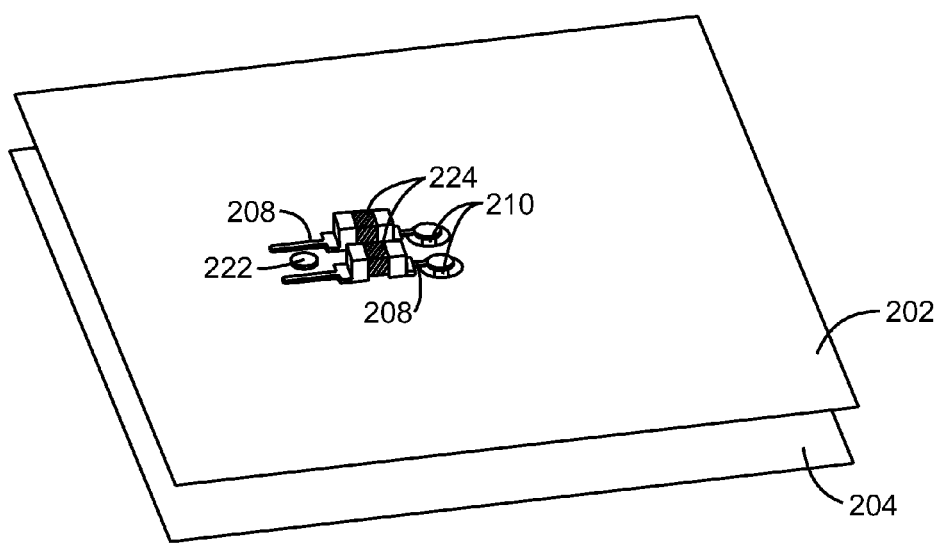
FIG. 3 is a top perspective view of the circuit board, in accordance with embodiments.

FIG. 3 is a top perspective view of the circuit board, in accordance with embodiments. As seen in FIG. 3, the signal trace 208 is disposed above the first reference plane 202 and coupled to the signal via 210. The DC blocking capacitor 224 can be coupled to the signal trace 208 such that the transmission signal passes through the DC blocking capacitor 224. The signal via 210 can be isolated from the first reference plane 202 by empty space or insulating layer.

Figure 4:
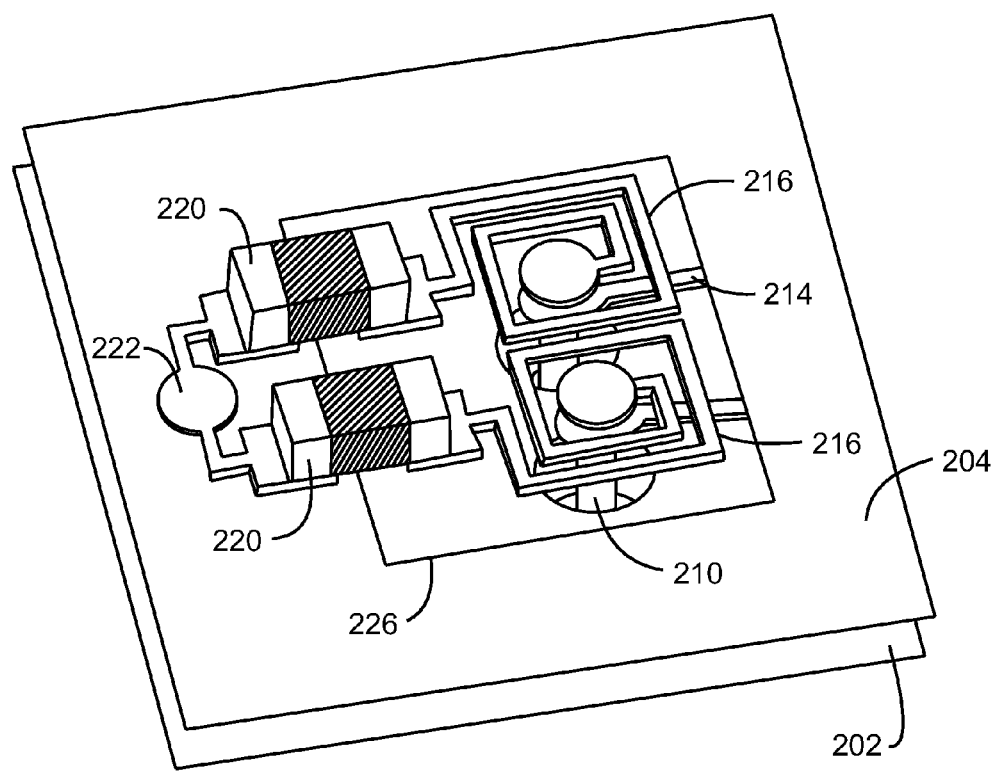
FIG. 4 is a bottom perspective view of the circuit board, in accordance with embodiments.

FIG. 4 is a bottom perspective view of the circuit board, in accordance with embodiments. As seen in FIG. 4, the second reference plane 204 contains a defected ground structure 226 adjacent to which the spiral inductor 216 resides. The defected ground structure 226 can be a hole, opening, or etch in the second reference plane 204 that can improve the effectiveness of the spiral inductor 216. The defected ground structure 226 can be rectangular, circular, in the shape of the spiral inductor 216, or have any other geometry. Furthermore, the spiral inductor 216 may contain a varying number of turns.

Figure 5A:
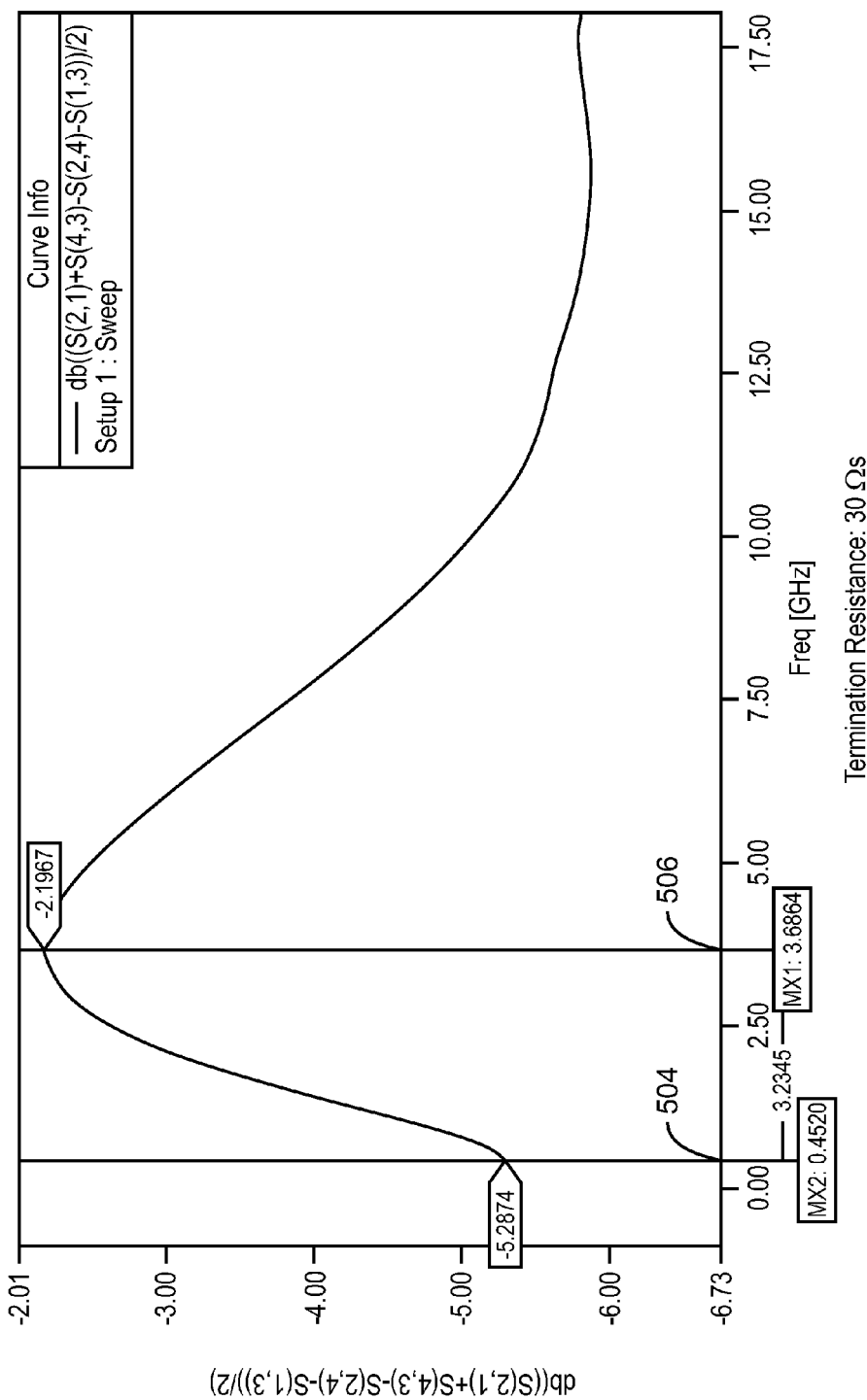
FIGS. 5A and 5B are frequency response plots illustrating the performance of passive equalization circuits.
Figure 5B:
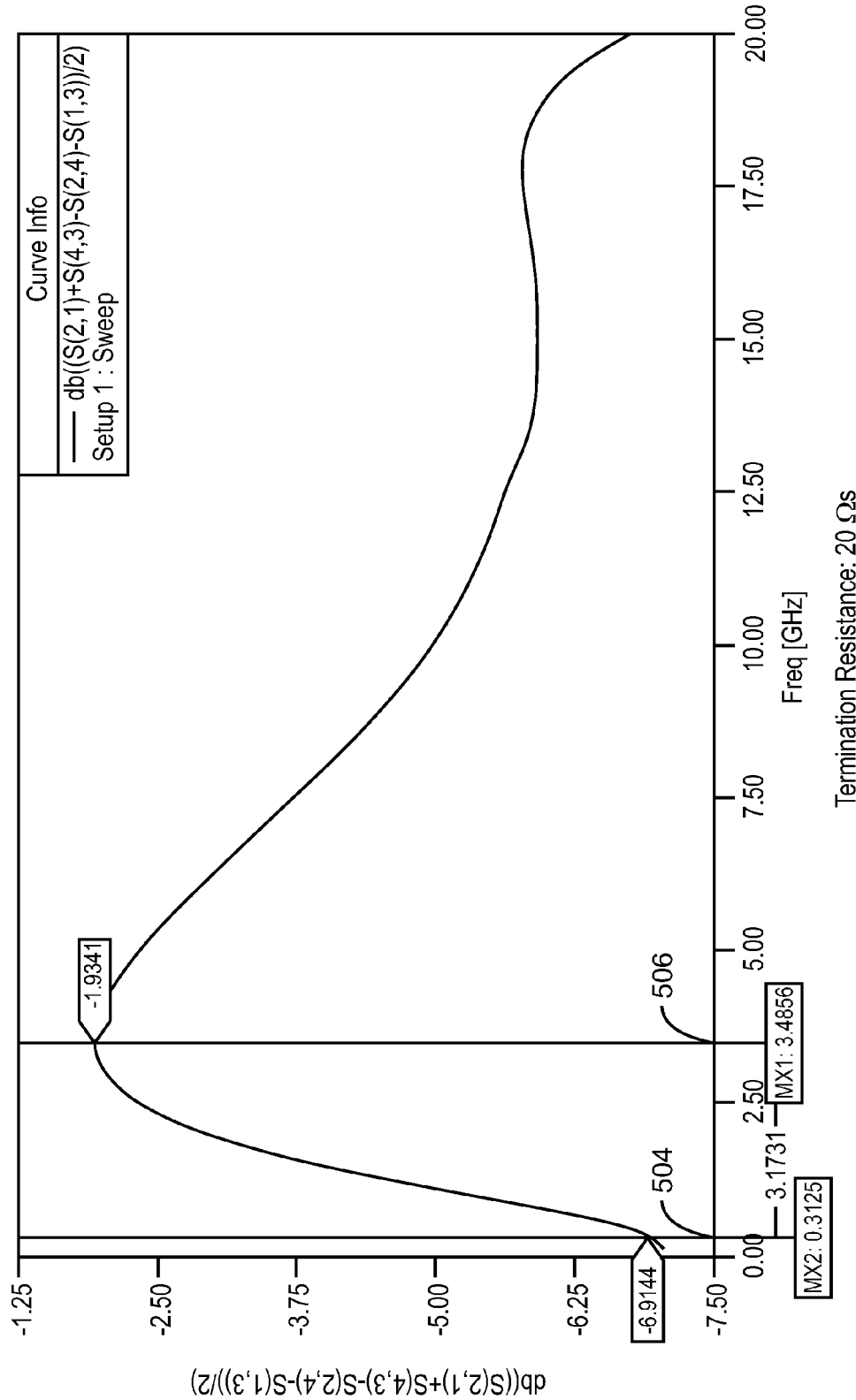

FIGS. 5A and 5B are frequency response plots illustrating the performance of passive equalization circuits. Plots 500 and 502 illustrate the curve of a transmission signal's insertion loss (represented on the vertical axis, wherein a higher absolute value indicates a higher amount of loss) as a function of the transmission signal's frequency (represented on the horizontal axis). As seen in FIGS. 5A and 5B, the insertion loss is shown to have an upward trend in a range between a minimum equalization frequency 504 and a peak equalization frequency 506. The minimum equalization frequency 504 represents the frequency in which only direct current is lost, and the peak equalization frequency 506 represents the frequency in which the highest magnitude of signal is lost. In this range, the amount of data lost from the transmission signal is lessened at higher frequencies. This trend can be the opposite of that which occurs in a wire without equalization, where a higher frequency can result in higher loss of data. Installing the passive equalization circuit into the wire may cause the level of insertion loss to remain relatively stable and independent of frequency.

It is to be noted that the type and geometry of the spiral inductor can affect the range, the peak equalization frequency 506, and the range of insertion loss (or equalization strength). The range, the peak equalization frequency 506, and the equalization strength can also be affected by the termination resistance. In the plot 500, the termination resistance is 30 Ohms, and the peak equalization frequency 506 is approximately 3.7 GHz. In the plot 502, the termination resistance is 20 Ohms, and the peak equalization frequency 506 is approximately 3.5 GHz.

Figure 6:
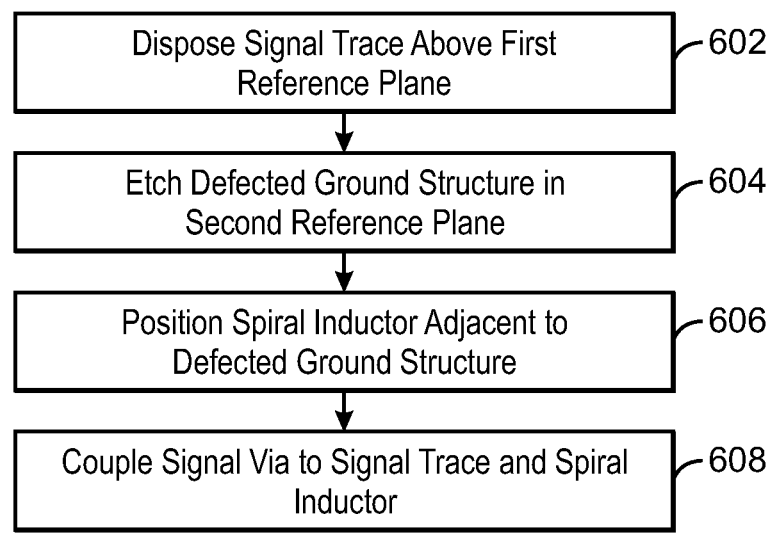
FIG. 6 is a process flow diagram of a method of manufacturing a circuit board, in accordance with embodiments.

FIG. 6 is a process flow diagram of a method of manufacturing a circuit board, in accordance with embodiments. The method 600 is used to manufacture a circuit board used for passive equalization in a transmission system. At block 602, a signal trace is disposed above a first reference plane. At block 604, a defected ground structure is etched in a second reference plane. At block 606, a spiral inductor is positioned adjacent to the defected ground structure. At block 608, a signal via is coupled to the signal trace and the spiral inductor.

Additionally, a ground via can be connected to the first and second reference planes, and coupled to the spiral inductor. A termination resistor can also be disposed on the second reference plane and coupled to the ground via and the spiral inductor. An exit trace can be coupled to the signal via. In some embodiments, a DC blocking capacitor can be coupled to the signal trace and disposed on the first reference plane.

Example 1

A circuit board for passive equalization is described herein. The circuit board includes a first reference plane and a second reference plane, wherein the second reference plane includes a defected ground structure. The circuit board includes a signal trace coupled to a signal via, wherein the signal trace is disposed above the first reference plane. The circuit board includes a spiral inductor positioned adjacent to the defected ground structure, wherein the spiral inductor is coupled to the signal via.

The circuit board may include a ground via connecting the first reference plane and the second reference plane. The ground via may be coupled to the spiral inductor. The circuit board may include a termination resistor disposed on the second reference plane, wherein the termination resistor is coupled to the spiral inductor and to the ground via. The circuit board may include an exit trace coupled to the signal via. The circuit board may include a direct current (DC) blocking capacitor coupled to the signal trace, wherein the DC blocking capacitor is disposed on the first reference plane. The circuit board may include an insulating layer between the signal trace and the first reference plane.

The signal trace may be used to transmit a Peripheral Component Interconnect Express (PCIe) signal. The signal trace may be used to transmit a Universal Serial Bus (USB) signal. The signal trace may be used to transmit a Serial Advanced Technology Advancement (SATA) signal or a Serial Attached Small Computer System Interface (SAS) signal. The signal trace may be used to transmit a Direct Media Interface (DMI) signal, a QuickPath Interconnect (QPI) signal, a Serial Management Interface (SMI) signal, or a KG-84 Trunk Interface (KTI) signal.

Example 2

An electronic device for passive equalization is described herein. The electronic device includes a circuit board. The circuit board includes a first reference plane and a second reference plane, wherein the second reference plane includes a defected ground structure. The circuit board includes a signal trace coupled to a signal via, wherein the signal trace is disposed above the first reference plane. The circuit board includes a spiral inductor positioned adjacent to the defected ground structure, wherein the spiral inductor is coupled to the signal via.

The circuit board may include a ground via connecting the first reference plane and the second reference plane. The ground via may be coupled to the spiral inductor. The circuit board may include a termination resistor disposed on the second reference plane, wherein the termination resistor is coupled to the spiral inductor and to the ground via. The circuit board may include an exit trace coupled to the signal via. The circuit board may include a direct current (DC) blocking capacitor coupled to the signal trace, wherein the DC blocking capacitor is disposed on the first reference plane. The circuit board may include an insulating layer between the signal trace and the first reference plane.

The signal trace may be used to transmit a Peripheral Component Interconnect Express (PCIe) signal. The signal trace may be used to transmit a Universal Serial Bus (USB) signal. The signal trace may be used to transmit a Serial Advanced Technology Advancement (SATA) signal or a Serial Attached Small Computer System Interface (SAS) signal. The signal trace may be used to transmit a Direct Media Interface (DMI) signal, a QuickPath Interconnect (QPI) signal, a Serial Management Interface (SMI) signal, or a KG-84 Trunk Interface (KTI) signal.

Example 3

A method of manufacturing a circuit board is described herein. The method includes disposing a signal trace above a first reference plane. The method includes etching a defected ground structure in a second reference plane. The method includes positioning a spiral inductor adjacent to the defected ground structure. The method includes coupling a signal via to the signal trace and the spiral inductor.

The method may include connecting a ground via to the first reference plane and the second reference plane. The method may include coupling the spiral inductor to the ground via. The method may include disposing a termination resistor on the second reference plane, coupling the termination resistor to the spiral inductor, and coupling the termination resistor to the ground via. The method may include coupling an exit trace to the signal via. The method may include disposing a DC blocking capacitor on the first reference plane, and coupling the DC blocking capacitor to the signal trace. The signal trace may be used to transmit a Peripheral Component Interconnect Express (PCIe) signal.

The signal trace may be used to transmit a Universal Serial Bus (USB) signal. The signal trace may be used to transmit a Serial Advanced Technology Advancement (SATA) signal or a Serial Attached Small Computer System Interface (SAS) signal. The signal trace may be used to transmit a Direct Media Interface (DMI) signal, a QuickPath Interconnect (QPI) signal, a Serial Management Interface (SMI) signal, or a KG-84 Trunk Interface (KTI) signal.

Although some embodiments have been described in reference to particular implementations, other implementations are possible according to some embodiments. Additionally, the arrangement and order of circuit elements or other features illustrated in the drawings or described herein need not be arranged in the particular way illustrated and described. Many other arrangements are possible according to some embodiments.

In each system shown in a figure, the elements in some cases may each have a same reference number or a different reference number to suggest that the elements represented could be different or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A circuit board, comprising:
   a first reference plane and a second reference plane, the second reference plane comprising a defected ground structure;
   a signal trace coupled to a signal via, the signal trace disposed above the first reference plane;
   a spiral inductor positioned adjacent to the defected ground structure, the spiral inductor coupled to the signal via; and
   a termination resistor disposed on the second reference plane, the termination resistor coupled to the spiral inductor and to a ground via.

2. The circuit board of claim 1, comprising the ground via connecting the first reference plane and the second reference plane.

3. The circuit board of claim 1, wherein the signal trace is used to transmit a Serial Advanced Technology Advancement (SATA) signal or a Serial Attached Small Computer System Interface (SAS) signal.

4. The circuit board of claim 1, wherein the signal trace is used to transmit a Direct Media Interface (DMI) signal, a QuickPath Interconnect (QPI) signal, a Serial Management Interface (SMI) signal, or a KG-84 Trunk Interface (KTI) signal.

5. The circuit board of claim 1, comprising an exit trace coupled to the signal via.

6. The circuit board of claim 1, comprising a direct current (DC) blocking capacitor coupled to the signal trace, the DC blocking capacitor disposed on the first reference plane.

7. The circuit board of claim 1, comprising an insulating layer between the signal trace and the first reference plane.

8. The circuit board of claim 1, wherein the signal trace is used to transmit a Peripheral Component Interconnect Express (PCIe) signal.

9. The circuit board of claim 1, wherein the signal trace is used to transmit a Universal Serial Bus (USB) signal.

10. An electronic device, comprising:
    a circuit board comprising:
      a first reference plane and a second reference plane, the second reference plane comprising a defected ground structure;
      a signal trace coupled to a signal via, the signal trace disposed above the first reference plane; and
      a spiral inductor positioned adjacent to the defected ground structure, the spiral inductor coupled to the signal via; and
      a direct current (DC) blocking capacitor coupled to the signal trace, the DC blocking capacitor disposed on the first reference plane.

11. The electronic device of claim 10, wherein the signal trace is used to transmit a Universal Serial Bus (USB) signal.

12. The electronic device of claim 10, wherein the signal trace is used to transmit a Serial Advanced Technology Advancement (SATA) signal or a Serial Attached Small Computer System Interface (SAS) signal.

13. The electronic device of claim 10, the circuit board comprising a ground via connecting the first reference plane and the second reference plane.

14. The electronic device of claim 13, the ground via coupled to the spiral inductor.

15. The electronic device of claim 14, the circuit board comprising a termination resistor disposed on the second reference plane, the termination resistor coupled to the spiral inductor and to the ground via.

16. The electronic device of claim 10, the circuit board comprising an exit trace coupled to the signal via.

17. The electronic device of claim 10, wherein the signal trace is used to transmit a Direct Media Interface (DMI) signal, a QuickPath Interconnect (QPI) signal, a Serial Management Interface (SMI) signal, or a KG-84 Trunk Interface (KTI) signal.

18. The electronic device of claim 10, comprising an insulating layer between the signal trace and the first reference plane.

19. The electronic device of claim 10, wherein the signal trace is used to transmit a Peripheral Component Interconnect Express (PCIe) signal.

20. A method of manufacturing a circuit board, comprising:
    disposing a signal trace above a first reference plane;
    etching a defected ground structure in a second reference plane;
    positioning a spiral inductor adjacent to the defected ground structure;
    coupling a signal via to the signal trace and the spiral inductor;
    disposing a termination resistor on the second reference plane;
    coupling the termination resistor to the spiral inductor; and
    coupling the termination resistor to the ground via.

21. The method of claim 20, comprising:
    disposing a DC blocking capacitor on the first reference plane; and
    coupling the DC blocking capacitor to the signal trace.

22. The method of claim 20, wherein the signal trace is used to transmit a Peripheral Component Interconnect Express (PCIe) signal.

23. The electronic device of claim 20, wherein the signal trace is used to transmit a Universal Serial Bus (USB) signal.

24. The method of claim 20, comprising connecting the ground via to the first reference plane and the second reference plane.

25. The electronic device of claim 20, wherein the signal trace is used to transmit a Serial Advanced Technology Advancement (SATA) signal or a Serial Attached Small Computer System Interface (SAS) signal.

26. The electronic device of claim 20, wherein the signal trace is used to transmit a Direct Media Interface (DMI) signal, a QuickPath Interconnect (QPI) signal, a Serial Management Interface (SMI) signal, or a KG-84 Trunk Interface (KTI) signal.

27. The method of claim 20, comprising coupling an exit trace to the signal via.

* * * * *